United States Patent
Kikuchi et al.

(10) Patent No.: US 10,553,967 B2
(45) Date of Patent: Feb. 4, 2020

(54) ELECTRONIC DEVICE HAVING FIXED CONDUCTIVE PLATES AND ELASTIC CONDUCTIVE PLATES

(71) Applicant: Alps Alpine Co., Ltd., Tokyo (JP)

(72) Inventors: Shinji Kikuchi, Miyagi-ken (JP);
Keisuke Nakayama, Miyagi-ken (JP);
Satoshi Waga, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/552,809

(22) Filed: Aug. 27, 2019

(65) Prior Publication Data

US 2019/0386411 A1    Dec. 19, 2019

Related U.S. Application Data

(63) Continuation of application No. PCT/JP2018/007082, filed on Feb. 27, 2018.

(30) Foreign Application Priority Data

Mar. 14, 2017  (JP) ................. 2017-048152

(51) Int. Cl.
*H01R 13/64*   (2006.01)
*H01R 12/55*   (2011.01)
(Continued)

(52) U.S. Cl.
CPC ........... *H01R 12/55* (2013.01); *H01R 4/4809* (2013.01); *H01R 13/428* (2013.01); *H05K 5/006* (2013.01); *H05K 5/0247* (2013.01)

(58) Field of Classification Search
CPC ............ H01R 23/7005; H01R 13/6658; H01R 13/6215; H05K 7/026; G01L 9/0002; G01L 19/0084
(Continued)

(56) References Cited

U.S. PATENT DOCUMENTS

| | | | |
|---|---|---|---|
| 6,018,992 A * | 2/2000 | Kaijala | ................. G01D 5/02 |
| | | | 73/114.36 |
| 6,204,749 B1 | 3/2001 | Ishihara | |

(Continued)

FOREIGN PATENT DOCUMENTS

| | | |
|---|---|---|
| JP | 10-32107 | 2/1998 |
| JP | 2001-4365 | 1/2001 |
| WO | WO 2011/158801 | 12/2011 |

OTHER PUBLICATIONS

International Search Report for corresponding International Application No. PCT/JP2018/007082, dated Apr. 24, 2018, 4 pages.

*Primary Examiner* — Thanh Tam T Le
(74) *Attorney, Agent, or Firm* — Brinks Gilson & Lione

(57) ABSTRACT

Fixed conductive plates are buried in a case. In its internal space, a first contact surface, which is part of each fixed conductive plate, and a second contact surface, which is an inner surface of the case, are opposite to each other, and an elastic conductive plate is interposed in this opposing portion. The support piece portion of the elastic conductive plate, is constrained from above by a restricting support portion and from below by a restricting opposing portion at a position close to a boundary portion with an elastic arm portion.

5 Claims, 6 Drawing Sheets

(51) Int. Cl.
*H05K 5/02* (2006.01)
*H01R 13/428* (2006.01)
*H01R 4/48* (2006.01)
*H05K 5/00* (2006.01)

(58) Field of Classification Search
USPC .......... 439/64, 76.1, 76.2, 364, 377; 73/726, 73/753
See application file for complete search history.

(56) References Cited

U.S. PATENT DOCUMENTS

| | | | |
|---|---|---|---|
| 6,637,260 B2 | 10/2003 | Hosogoe | |
| 6,953,031 B2 * | 10/2005 | Ishihara | G01D 5/165 123/568.21 |
| 7,225,679 B2 * | 6/2007 | Miyagawa | G01L 9/0051 73/753 |
| 7,484,417 B2 * | 2/2009 | Tohyama | G01L 19/0084 73/705 |
| 7,618,265 B2 * | 11/2009 | Rueggen | H01R 4/4809 439/259 |
| 7,780,480 B2 * | 8/2010 | Caveney | H01R 13/6658 439/676 |
| 8,152,536 B2 * | 4/2012 | Scherer | H01L 31/02008 439/76.1 |
| 8,267,702 B2 * | 9/2012 | De La Reza | B60R 16/0238 439/76.1 |
| 8,608,489 B2 * | 12/2013 | Nogami | H01R 13/6658 439/377 |
| 8,721,351 B2 * | 5/2014 | Nitta | G01B 7/003 439/76.1 |
| 2003/0167858 A1 | 9/2003 | Terui et al. | |

* cited by examiner

ELECTRONIC DEVICE HAVING FIXED CONDUCTIVE PLATES AND ELASTIC CONDUCTIVE PLATES

CLAIM OF PRIORITY

This application is a Continuation of International Application No. PCT/JP2018/007082 filed on Feb. 27, 2018, which claims benefit of Japanese Patent Application No. 2017-048152 filed on Mar. 14, 2017. The entire contents of each application noted above are hereby incorporated by reference.

BACKGROUND

1. Field of the Disclosure

The present disclosure relates to an electronic device that includes, in a case, fixed conductive plates and elastic conductive plates pressed elastically against fixed electrode portions provided on a circuit board or the like on which a physical quantity sensor is mounted.

2. Description of the Related Art

An invention related to an electronic part in which external terminals (fixed conductive plates) and internal terminals (elastic conductive plates) are provided in a cabinet 1 is described in Japanese Unexamined Patent Application Publication No. 10-32107.

This electronic part includes external terminals 2 fixed in the cabinet 1. Each external terminal 2 is bent to form a flat portion 2a and an opposing portion 2f so that they face each other. An internal terminal 3, which can be elastically deformed, is attached between the flat portion 2a and opposing portion 2f of the external terminal 2. A flat portion 3a, a first elastic portion 3b bent from the flat portion 3a, and an abutting portion 3c at the top of the first elastic portion 3b are formed integrally with the internal terminal 3. The flat portion 3a is elastically in contact with the flat portion 2a of the external terminal 2, and the abutting portion 3c is elastically in contact with the opposing portion 2f of the external terminal 2. A 180-degree turn-back portion is provided at the top of the flat portion 3a of the internal terminal 3. A second elastic portion 3d extends from the turn-back portion. A contact point 3e at the top of the second elastic portion 3d is elastically in contact with a resistive pattern 4a on the front surface of an insulated substrate 4.

The internal terminal 3 integrally has a stopper portion 3f, which is formed by cutting part of the flat portion 3a and raising the cut portion. This stopper portion 3f is engaged with a concave portion 2b formed in the external terminal 2 or with a concave portion 1t formed in a side wall of the cabinet 1 to prevent the internal terminal 3 from coming off.

In the electronic part described in Japanese Unexamined Patent Application Publication No. 10-32107, the stopper portion 3f, which is cut from the flat portion 3a of the internal terminal 3 and is raised, is engaged with the concave portion 2b or concave portion 1t to prevent the internal terminal 3 from coming off. However, this engagement between the stopper portion 3f and the concave portion alone is insufficient to adequately prevent the internal terminal 3 from coming off. To more efficiently prevent the internal terminal 3 from coming off, it is necessary to make the stopper portion 3f long. This causes a problem in that the internal terminal 3 becomes larger than necessary.

Another problem with the electronic part described in Japanese Unexamined Patent Application Publication No. 10-32107 is that the top of the flat portion 3a of the internal terminal 3 is turned back 180 degrees as illustrated in FIGS. 3 and 4 in the publication. By providing this 180-degree turn-back portion, the position of the base end of the internal terminal 3 extending from the turn-back portion is determined. In this structure, however, when a force is exerted on the second elastic portion 3d, stress concentrates on the 180-degree turn-back portion. This is likely to become a cause of fatigue.

SUMMARY

In an electronic device in which a fixed conductive plate, part of which becomes an external terminal portion, an elastic conductive plate connected to the fixed conductive plate, and a fixed electrode portion that is electrically continuous to the elastic conductive plate are provided in a case, the electronic device has a fixed conductive plate and an elastic conductive plate. In the electronic device:

a first contact surface and a second contact surface, which are opposite to each other, are provided in the case.

At least one of the first contact surface and the second contact surface comprise the front plate surface of the fixed conductive plate. The elastic conductive plate is integrally formed from a metal leaf spring material, a first pressure contact portion, which is elastically pressed against the first contact surface, a second pressure contact portion, which is turned-backed from the first pressure contact portion and is elastically pressed against the second contact surface, a support piece portion, which is bent from the second pressure contact portion and extends beyond the first contact surface, an elastic arm portion, which is bent from the support piece portion and extends toward the fixed electrode portion, and an elastically-pressed contact point, which is provided at the top of the elastic arm portion so as to be elastically pressed against the fixed electrode portion; at least one of the first pressure contact portion and the second pressure contact portion is in contact with the front plate surface of the fixed conductive plate; and a restricting support portion is provided on a side opposite to the fixed electrode portion with the elastic conductive plate interposed between the restricting support portion and the fixed electrode portion, the restricting support portion restricting the travel of the support piece portion in a direction away from the fixed electrode portion.

DESCRIPTION OF THE EXEMPLARY EMBODIMENTS

Figure 1:
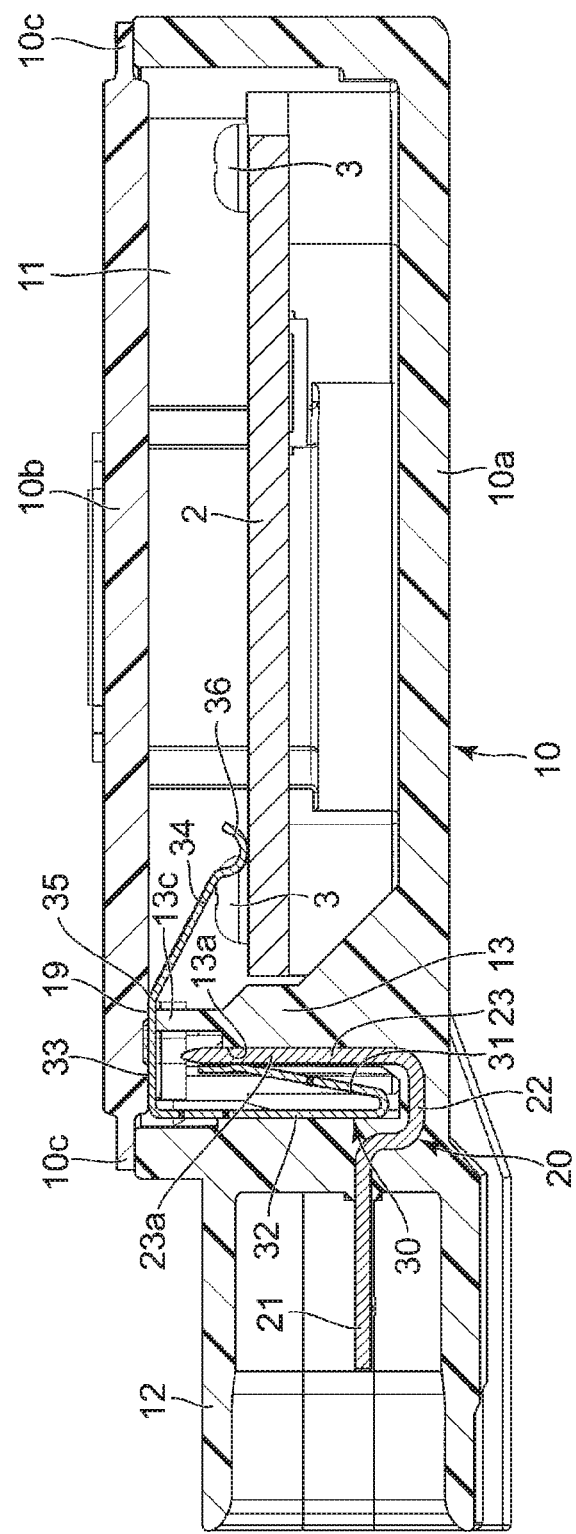
FIG. 1 is a cross-sectional view illustrating an electronic device in an embodiment of the present invention.
Figure 2:
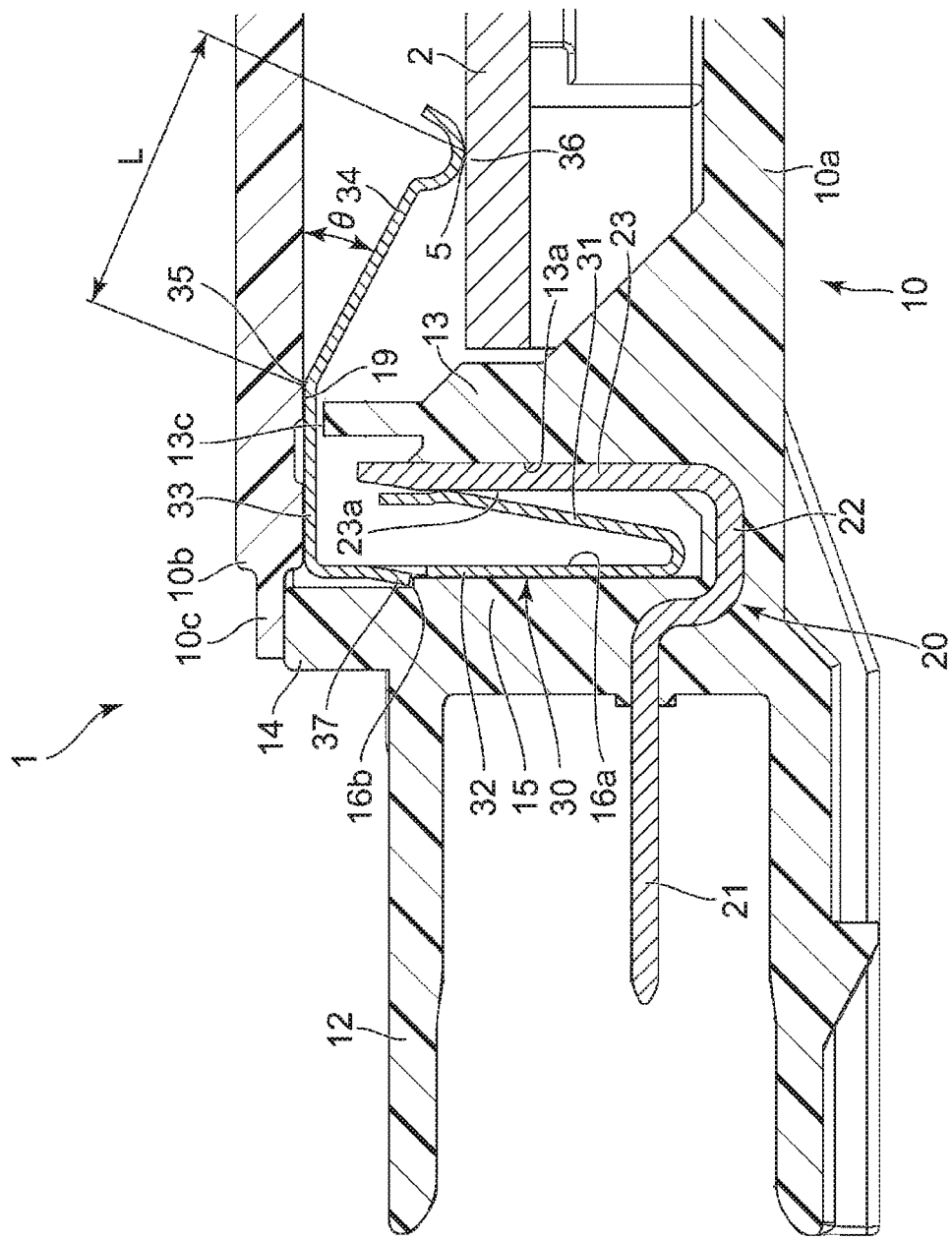
FIG. 2 is a partially enlarged view of the cross-section of the electronic device in the embodiment illustrated in FIG. 1.
Figure 3:
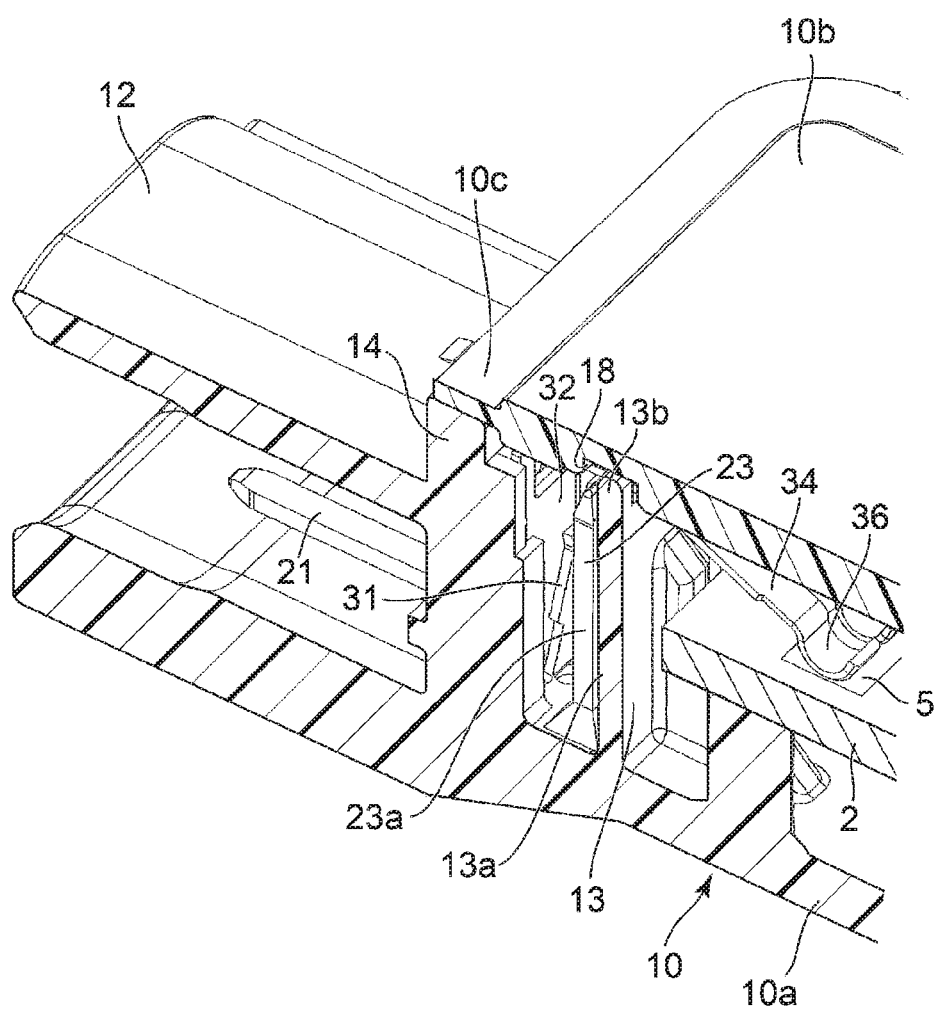
FIG. 3 is a perspective view illustrating the structure of the electronic device in the embodiment illustrated in FIG. 1, the drawing including a partial cross-section.
Figure 4:
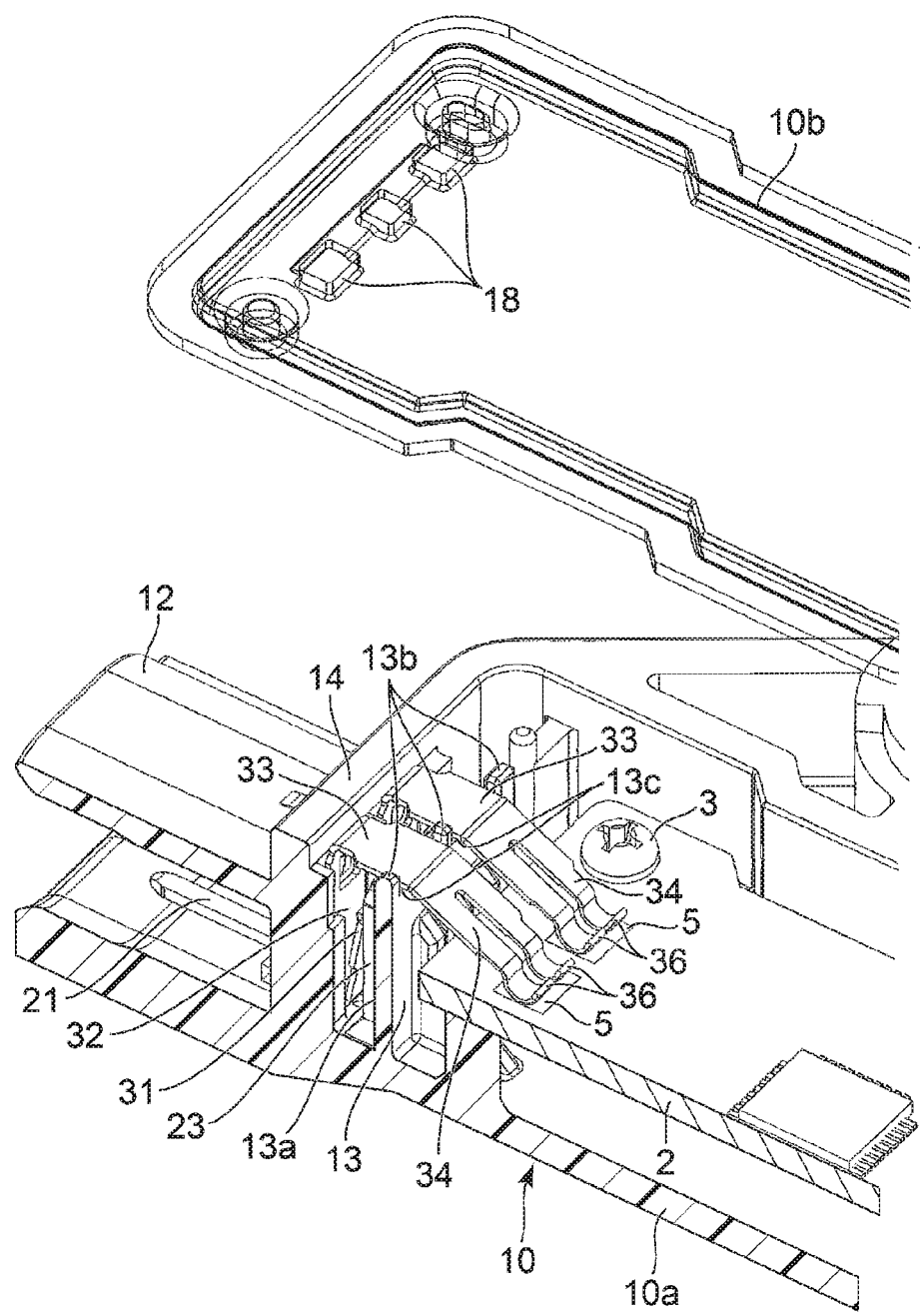
FIG. 4 is an exploded perspective view illustrating the structure of the electronic device in the embodiment illustrated in FIG. 1, the drawing including a partial cross-section of a first case and illustrating a second case in a transparent display.
Figure 5:
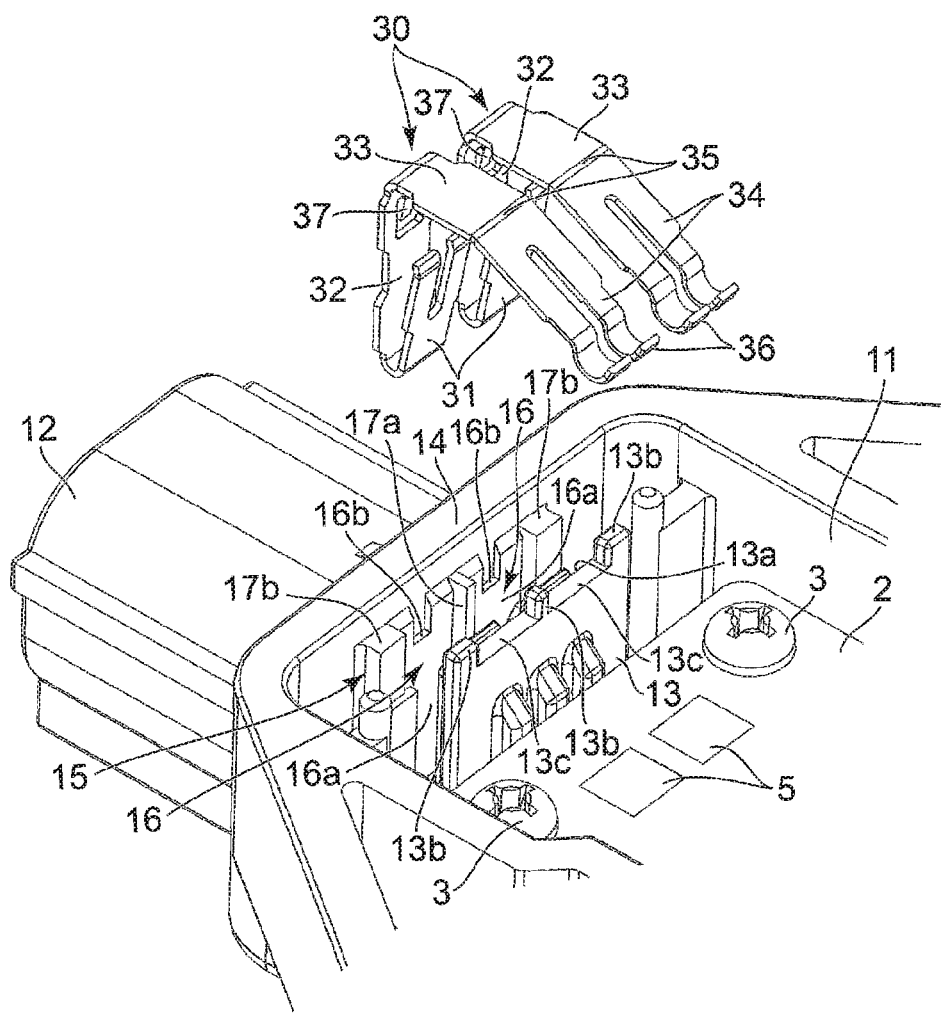
FIG. 5 is an exploded perspective view illustrating the structure of the electronic device in the embodiment illustrated in FIG. 1, the drawing an illustrating the first case and elastic conductive plates.

FIGS. 1 and 2 are each a cross-sectional view of an electronic device 1 in an embodiment of the present invention. FIG. 3 is a perspective view of the electronic device 1, including a partial cross-section. FIG. 4 is an exploded perspective view of the electronic device 1, including a partial cross-section. FIG. 5 is also an exploded perspective view of the electronic device 1.

In this electronic device 1, a circuit board 2 is accommodated in internal space 11 in a case (cabinet) 10. As illustrated in FIGS. 4 and 5, the circuit board 2 is fixed to the case 10 with fixing screws 3. On the circuit board 2, an acceleration sensor is mounted as a physical quantity sensor. The physical quantity sensor is not limited to an acceleration sensor; the physical quantity sensor may be a pressure sensor, a humidity sensor, an angular velocity sensor, or the like. The electronic device 1 is for use in a vehicle. The electronic device 1 is attached to, for example, the axle or its support portion to detect acceleration exerted on the vehicle body. Therefore, the electronic device 1 is needed to be structured so that even if large acceleration is exerted on the electronic device 1, a contact failure or the like is not caused in the internal structure.

The case 10 is made of a synthetic resin. The case 10 is structured by combining a first case 10a forming the internal space 11 and a second case 10b, in a cover body structure, that covers the opening portion of the internal space 11. The edge 10c of the second case 10b is bonded and fixed to the opening end of the first case 10a. Alternatively, the edge 10c is fixed by screwing or laser welding. In FIG. 4, the second case 10b is illustrated as being transparent.

As illustrated in FIGS. 1 to 5, a connector portion 12 in a hollow shape is formed integrally with the first case 10a on its left side in the drawing. As illustrated in FIGS. 1 and 2, fixed conductive plates 20 are buried in the first case 10a. The first case 10a is injection-molded from a synthetic resin. During this molding, the fixed conductive plates 20 are inserted into a mold and the first case 10a and fixed conductive plates 20 are integrated together by so-called insert-molding. However, the fixed conductive plates 20 may be fixed in another method; for example, after the first case 10a has been molded, the fixed conductive plates 20 may be inserted into the already-molded first case 10a.

The fixed conductive plate 20 is formed from a conductive metal plate made of brass or the like. The fixed conductive plate 20 has an external terminal portion 21. The external terminal portion 21 protrudes from the first case 10a into the interior of the connector portion 12. As illustrated in FIGS. 1 and 2, portions, of the fixed conductive plate 20, that are buried in the first case 10a are the base of the external terminal portion 21 and a bent bottom 22, which is bent from the base in the downward direction in the drawings.

As illustrated in FIGS. 4 and 5, an inner wall portion 13 erected from the bottom side in the drawings toward the internal space 11 is preferably formed integrally with the first case 10a. As illustrated in FIGS. 1 and 2, the fixed conductive plate 20 includes a contact plate portion 23 bent from the bent bottom 22 substantially at right angles. The contact plate portion 23 is supported in a state in which the contact plate portion 23 is in tight contact with an opposing inner surface 13a of the inner wall portion 13.

As illustrated in FIG. 5, the first case 10a has a peripheral wall portion 14 continuous to the connector portion 12. A peripheral wall support portion 15 opposite to the inner wall portion 13 is formed integrally with an inner wall, facing the internal space 11, of the peripheral wall portion 14. A pair of holding concave portions 16 extending in the up-and-down direction is formed in the peripheral wall support portion 15. A partitioning rib 17a extending in the up-and-down direction is integrally formed between the two holding concave portions 16. Partitioning ribs 17b extending in the up-and-down direction are formed at the ends of the holding concave portions 16, one partitioning rib 17b at each end.

The contact plate portion 23 of the fixed conductive plate 20 is illustrated in FIG. 2. The front plate surface of the contact plate portion 23, the front plate surface being opposite to the peripheral wall support portion 15, is a first contact surface 23a. As illustrated in FIG. 5 as well, the inner front surface of the holding concave portion 16 is a second contact surface 16a. In the internal space 11 of the case 10, the first contact surface 23a and second contact surface 16a are opposite to each other in parallel. In this embodiment, the first contact surface 23a is the front plate surface of the contact plate portion 23 of the fixed conductive plate 20, and the second contact surface 16a is the front surface of a synthetic resin material from which the case 10 is formed. Contrary to this embodiment, however, the first contact surface 23a may be the front surface of the inner wall portion 13, and the second contact surface 16a may be the front plate surface of the fixed conductive plate 20 positioned in the holding concave portion 16. Alternatively, both the first contact surface 23a and second contact surface 16a may be the front plate surface of the fixed conductive plate 20.

Figure 6:
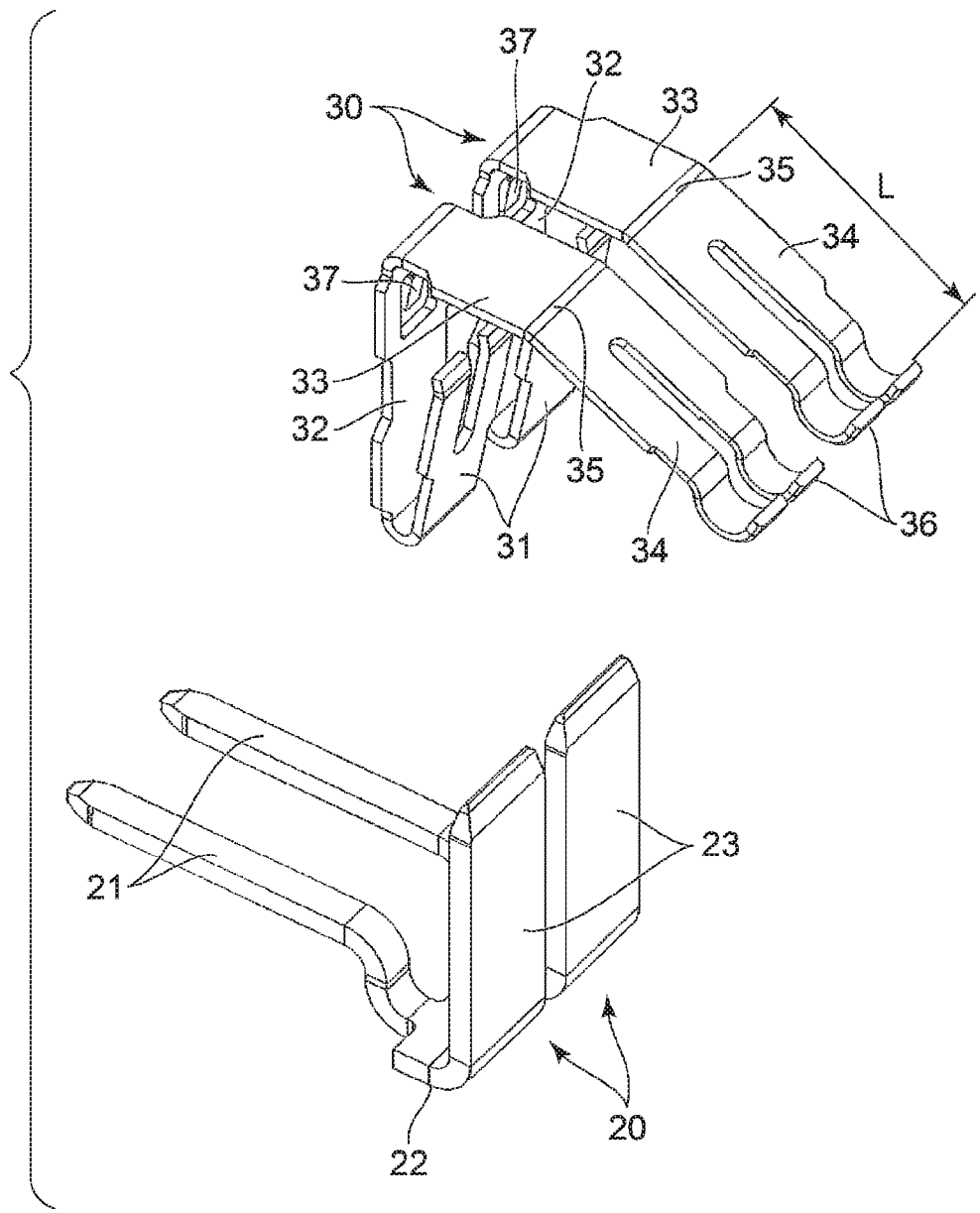
FIG. 6 is an exploded perspective view illustrating fixed conductive plates and elastic conductive plates provided in the electronic device in the embodiment illustrated in FIG. 1.

In the internal space 11 of the case 10, an opposing portion between the first contact surface 23a and the second contact surface 16a is space in which the elastic conductive plate 30 is accommodated. The elastic conductive plate 30 is formed from a leaf spring metal material such as a stainless steel material or beryllium copper material. As illustrated in FIGS. 5 and 6, part of the elastic conductive plate 30 is bent in a V-shape, forming a first pressure contact portions 31 and a second pressure contact portions 32. The elastic conductive plate 30 is inserted into the case 10 while the bent portion between the first pressure contact portion 31 and the second pressure contact portion 32 faces downward. At that time, the second pressure contact portion 32 is downwardly inserted into the holding concave portion 16 formed in the peripheral wall support portion 15.

Therefore, a pair of elastic conductive plates 30 is attached in the accommodation space. When the elastic conductive plates 30 are attached, the first pressure contact portion 31 is elastically pressed against the first contact surface 23a and the second pressure contact portion 32 is elastically pressed against the second contact surface 16a, as illustrated in FIG. 2. Since the first contact surface 23a is the front plate surface of the fixed conductive plate 20, the fixed conductive plate 20 and elastic conductive plate 30 are electrically continuous to each other on the first contact surface 23a.

As illustrated in FIGS. 5 and 6, each elastic conductive plate 30 integrally has a support piece portion 33, which is bent from the top of the second pressure contact portion 32 substantially at right angles. As illustrated in FIG. 5, a plurality of support protrusion portions 13b (specifically, three support protrusion portions 13b) preferably protrude from the upper end of the inner wall portion 13 formed in the first case 10a so as to be spaced. An interval between adjacent support protrusion portions 13b is preferably a restricting opposing portion 13c. As illustrated in FIG. 4, the support piece portion 33 formed for each elastic conductive plate 30 is accommodated between adjacent support protrusion portions 13b.

Thus, with the elastic conductive plate 30, the second pressure contact portion 32 is held by the holding concave portion 16 and the support piece portion 33 is accommodated in a clearance between adjacent support protrusion portions 13b, so the elastic conductive plate 30 is firmly fixed in the second case 10b without, for example, being easily swung.

As illustrated in FIGS. 3 and 4, opposing concave portions 18 are preferably formed in the lower surface of the second case 10b. When the second case 10b is fixed to the first case 10a, the upper portion of each support protrusion portion 13b enters the relevant opposing concave portion 18. Therefore, the support piece portion 33 does not move beyond the support protrusion portion 13b at either of both ends of the support piece portion 33 toward the end, so the support piece portion 33 is reliably held between the support protrusion portions 13b.

As illustrated in FIGS. 2, 5, and 6, the elastic conductive plate 30 has a cut-and-raised piece 37 facing downward, which is cut and raised toward the left in the drawing, is formed in the second pressure contact portion 32. As illustrated in FIG. 5, a fitting concave portion is formed in the second contact surface 16a on the inner side of each holding concave portion 16 in the first case 10a. The lower end in the fitting concave portion is a stopper step portion 16b. When the first pressure contact portion 31 of the elastic conductive plate 30 is downwardly inserted into the holding concave portion 16, the cut-and-raised piece 37 is fitted into the stopper step portion 16b, making it possible to determine a pressing position when the elastic conductive plate 30 is to be pressed into the first case 10a.

On the lower surface of the second case 10b, as illustrated in FIG. 2, a portion opposite to the support piece portion 33 is a restricting support portion 19. The restricting support portion 19 faces the support piece portion 33 of the elastic conductive plate 30 from a side opposite to a fixed electrode portion 5 (on the circuit board 2) is provided. The support piece portion 33 is elastically pressed against the restricting support portion 19 by a reaction force resulting from an elastically-pressed contact point 36 being elastically pressed against the fixed electrode portion 5. Preferably, as illustrated in FIG. 2, the restricting support portion 19 is in contact with the support piece portion 33 at a boundary portion 35 between the support piece portion 33 and an elastic arm portion 34 or in the vicinity of the boundary portion 35. Also, the restricting opposing portion 13c formed at the upper end of the inner wall portion 13 may be opposite to the restricting support portion 19 with the support piece portion 33 intervening between them. Preferably, at the boundary portion 35 or in the vicinity of the boundary portion 35, the restricting opposing portion 13c is opposite to the front surface of the support piece portion 33, the front surface facing in the downward direction in the drawing, with a clearance left or is in contact with the front surface.

As illustrated in FIG. 2, the support piece portion 33 is constrained from above by the restricting support portion 19 and from below by the restricting opposing portion 13c, and the cut-and-raised piece 37 is fitted to the stopper step portion 16b. Therefore, the upward and downward movement of the elastic conductive plate 30 in the case 10 is restricted. With the elastic conductive plate 30, the second pressure contact portion 32 is held in the holding concave portion 16 illustrated in FIG. 5, the support piece portion 33 is inserted between adjacent support protrusion portions 13b, and the movement of the elastic conductive plate 30 is restricted by the restricting support portion 19, restricting opposing portion 13c, and cut-and-raised piece 37. Due to these restricting structures, even if large acceleration is exerted from the outside, it is possible to reliably restrict the elastic conductive plate 30 from moving in the internal space 11 of the case 10.

As illustrated in FIGS. 1 and 2, the support piece portion 33 of the elastic conductive plate 30 passes beside the first contact surface 23a, passes through a clearance between the restricting support portion 19 and the restricting opposing portion 13c, and extends toward the interior of the internal space 11. The elastic arm portion 34 integrally extends from the support piece portion 33. The elastic arm portion 34 is bent downward from the boundary portion 35 between the support piece portion 33 and the elastic arm portion 34, and the top of the elastic arm portion 34 is the elastically-pressed contact point 36, which is deformed in a concavely curved surface shape. The elastic arm portion 34 extends toward the fixed electrode portion 5 provided on the front surface of the circuit board 2, and the elastically-pressed contact point 36 is elastically pressed against the fixed electrode portion 5.

The fixed conductive plate 20 and elastic conductive plate 30 each have a gold-plated layer formed at least on the front surface of a conductive contact portion. The gold-plated layer is formed on the front surface of a substrate layer formed from nickel or the like.

The electronic device 1 is mounted on the axle of a vehicle, its support portion, or the like. The acceleration of the vehicle body is detected by an acceleration sensor mounted on the circuit board 2. Alternatively, other various types of information may be detected by other physical quantity sensors. Detection signals of the acceleration sensor and the like undergo information processing by an integrated circuit (IC) chip or the like mounted on the circuit board 2. The elastically-pressed contact points 36 of a pair of elastic conductive plates 30 are each elastically pressed against the fixed electrode portion 5, and the signal that has undergone information processing is transmitted from a conductive pattern on the circuit board 2 through the fixed electrode portion 5 to the elastic conductive plate 30. Furthermore, the first pressure contact portion 31 of the elastic conductive plate 30 is in contact with the contact plate portion 23 of the fixed conductive plate 20, the signal that has undergone information processing is given from the pair of elastic conductive plates 30 to a pair of fixed conductive plates 20. A plug is fitted into the connector portion 12 of the case 10.

In the electronic device 1, the support piece portion 33 of the elastic conductive plate 30 can be constrained from above by the restricting support portion 19 and from below by the restricting opposing portion 13c at a place close to the boundary portion 35. Since the elastically-pressed contact point 36 of the elastic conductive plate 30 is brought into pressure contact with the fixed electrode portion 5 on the circuit board 2, the support piece portion 33 is pressed in a direction away from the fixed electrode portion 5 due to the reaction force of the elastically-pressed contact point 36.

At the same time, the support piece portion 33 is partially pressed against to the restricting support portion 19 in the vicinity of the boundary portion 35. As a result, with the boundary portion 35 taken as a base end (support end), it becomes possible to set the working length L of the elastic arm portion 34, which functions as a cantilever beam, with high dimensional precision as the length between the boundary portion 35 and the elastically-pressed contact point 36. Therefore, an appropriate elastic force can be set between the elastically-pressed contact point 36 and the fixed electrode portion 5.

With the elastic conductive plate 30, a bending angle between the second pressure contact portion 32 and the support piece portion 33 is approximately 90 degrees. As illustrated in FIG. 2, an angle θ by which the elastic arm portion 34 is bent from the support piece portion 33 is 90 degrees or less and is 45 degrees or less. Furthermore, a 180-degree turn-back portion as described in Japanese Unexamined Patent Application Publication No. 10-32107 is not provided. Therefore, it becomes possible to prevent large stress from concentrating on the base end (support end, that is, boundary portion 35) of the elastic arm portion 34.

What is claimed is:

1. An electronic device comprising:
    a fixed conductive plate, part of which is an external terminal portion;
    an elastic conductive plate connected to the fixed conductive plate;
    a fixed electrode portion that is electrically continuous to the elastic conductive plate; and
    a case in which the fixed conductive plate, the elastic conductive plate, and the fixed electrode portion are disposed; wherein:
    a first contact surface and a second contact surface, which are opposite to each other, are provided in the case, at least one of the first contact surface and the second contact surface being a front plate surface of the fixed conductive plate,
    the elastic conductive plate is an integrally formed plate comprising a leaf spring metal material, a first pressure contact portion, which is elastically pressed against the first contact surface, a second pressure contact portion, which is turned-backed from the first pressure contact portion and is elastically pressed against the second contact surface, a support piece portion, which is bent from the second pressure contact portion and extends beyond the first contact surface, an elastic arm portion, which is bent from the support piece portion and extends toward the fixed electrode portion, and an elastically-pressed contact point, which is provided at a top of the elastic arm portion so as to be elastically pressed against the fixed electrode portion,
    at least one of the first pressure contact portion and the second pressure contact portion is in contact with the front plate surface of the fixed conductive plate, and
    a restricting support portion is provided on a side opposite to the fixed electrode portion with the elastic conductive plate interposed between the restricting support portion and the fixed electrode portion, the restricting support portion restricting travel of the support piece portion in a direction away from the fixed electrode portion.

2. The electronic device according to claim 1, wherein a restricting opposing portion is provided, the restricting opposing portion being opposite to the restricting support portion with the support piece portion interposed between the restricting opposing portion and the restricting support portion or being in contact with the support piece portion.

3. The electronic device according to claim 2, wherein the restricting support portion and the restricting opposing portion are opposite to each other at a position close to a boundary portion of the support piece portion with the elastic arm portion.

4. The electronic device according to claim 2, wherein:
    an inner wall portion is provided in the case;
    a plurality of support protrusion portions are provided at a top of the inner wall; and
    the restricting opposing portion is provided between adjacent support protrusion portions.

5. The electronic device according to claim 4, wherein:
    an opposing concave portion is in the case so that the support protrusion portion is opposite to the opposing concave portion; and
    a top of the support protrusion portion is inserted into the opposing concave portion.

* * * * *